United States Patent
Arnoux et al.

(10) Patent No.: US 6,667,894 B2
(45) Date of Patent: Dec. 23, 2003

(54) ACQUISITION PROCESS BY ANALOG SIGNAL SAMPLING, AND AN ACQUISITION SYSTEM TO IMPLEMENT SUCH A PROCESS

(75) Inventors: Daniel Arnoux, Paris (FR); Claude Genter, Paris (FR); Francisque Pion, Paris (FR)

(73) Assignee: Chauvin Arnoux, Paris (FR)

(*) Notice: Subject to any disclaimer, the term of this patent is extended or adjusted under 35 U.S.C. 154(b) by 0 days.

(21) Appl. No.: 10/022,839

(22) Filed: Dec. 20, 2001

(65) Prior Publication Data

US 2003/0012057 A1 Jan. 16, 2003

(30) Foreign Application Priority Data

Dec. 20, 2000 (FR) .......................................... 00 16 678

(51) Int. Cl.⁷ .............................................. G11C 27/00
(52) U.S. Cl. ........................ 365/45; 365/191; 365/194; 365/200; 365/231; 327/33; 327/91; 327/94
(58) Field of Search .......................... 365/45, 200, 194, 365/191, 231; 327/33, 91, 94

(56) References Cited

U.S. PATENT DOCUMENTS

| | | | |
|---|---|---|---|
| 4,271,488 A | | 6/1981 | Saxe |
| 5,526,286 A | | 6/1996 | Sauerwein et al. |
| 5,526,301 A | * | 6/1996 | Saxe ............................ 365/45 |
| 5,805,492 A | * | 9/1998 | Gerna et al. ................... 365/45 |
| 6,091,619 A | * | 7/2000 | Kogan .......................... 365/45 |

FOREIGN PATENT DOCUMENTS

JP            11-283396          10/1999

* cited by examiner

*Primary Examiner*—Richard Elms
*Assistant Examiner*—Pho Luu
(74) *Attorney, Agent, or Firm*—Leydig, Voit & Mayer, Ltd.

(57) ABSTRACT

An acquisition process for signal sampling includes high-speed analog signal sampling, storing the samples of the analog signal in a matrix of memory cells, and re-reading the samples from the cells at low speed. Two identical memory devices are provided in each memory cell. One sample of an analog signal is stored in one memory device, and one sample of that signal that is out of phase is stored in the other memory device.

11 Claims, 1 Drawing Sheet

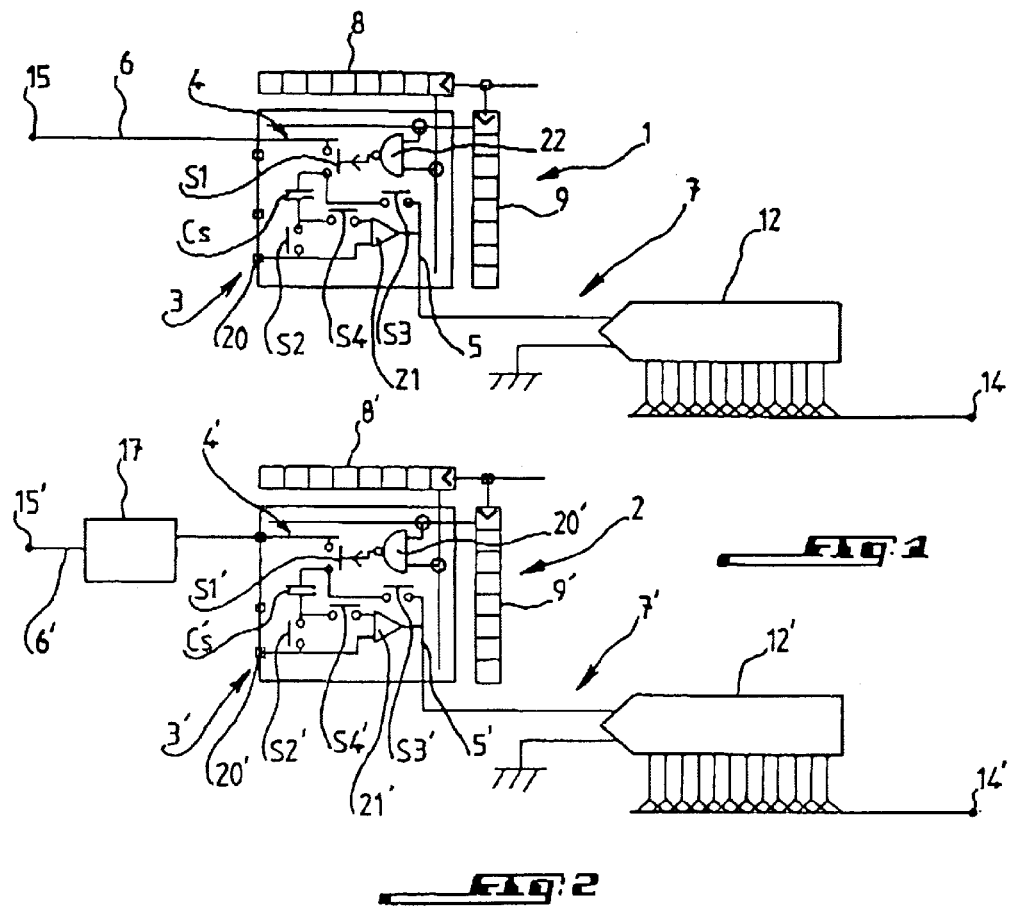
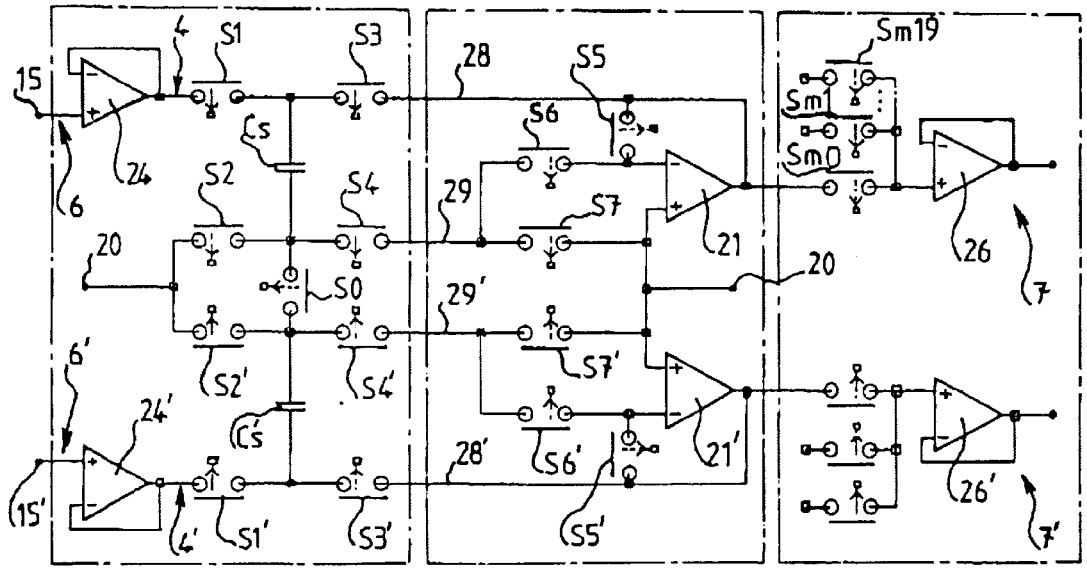

ACQUISITION PROCESS BY ANALOG SIGNAL SAMPLING, AND AN ACQUISITION SYSTEM TO IMPLEMENT SUCH A PROCESS

FIELD OF THE INVENTION

The invention concerns an acquisition process first sampling analog signals, comprising high-speed analog signal sampling, storing signal samples in a matrix of memory cells, and re-reading the samples from the cells at low speed, and an acquisition system to implement such a process.

BACKGROUND

Known sampling systems have the particular disadvantage of too high a noise level and, as a consequence, relatively low useful signal-to-noise ratios.

SUMMARY OF THE INVENTION

The purpose of the invention is to provide an acquisition system for analog signal sampling which eliminates the above-mentioned disadvantages.

To achieve that goal, the acquisition system according to the invention includes two identical memory devices are provided in each memory cell, where one sample of an analog signal is stored in one memory device and a sample of that signal more or less out of phase is stored in the other device.

According to one characteristic of the invention, the out-of-phase signal is delayed in relation to the in-phase signal before being applied to the corresponding write bus channel for a predetermined period of time, advantageously equal to one half-period of the sampling signal.

The acquisition system for analog signal sampling according to the invention, comprises a matrix of analog memory cells arranged in a plurality of rows and columns, each cell being connected to a write bus and a read bus, and having two inputs for activation control signals received from a clock signal, a horizontal shift register and a vertical register, designed to deliver activation control signals to the cells for the writing and reading functions of the cells, wherein the write bus and the read bus each have two channels, that one of the two write bus channels receives the analog signal to be sampled more or less out of phase in relation to the other channel, and that each memory cell includes two memory devices, each of which is connected to one of the two write bus channels and read bus channels.

BRIEF DESCRIPTION OF DRAWING FIGURES.

The invention will be better understood, and other purposes, characteristics, details, and advantages of the invention will be clearly set forth in the explanatory description that follows, with reference to the attached schematic drawings given by way of example only and illustrating one embodiment form of the invention, wherein:

Figure 1 is a schematic illustration of an acquisition system for analog signal sampling according to the invention, comprising two memory matrices; and FIG. 2 is a schematic illustration of the structure of a memory cell according to the invention.

DETAILED DESCRIPTION

FIG. 1 schematically illustrates that a system of acquisition of analog signal by sampling according to the invention is the result of a combination of two individual sampling structures, each of which comprises a matrix 1, 2 of analog memory cells arranged in rows and columns, where only one cell is represented in 3, 3'. Each cell is connected, in a known manner, to write bus 4 and read bus 5, which are respectively connected to input circuit 6 and output circuit 7 for matrix 1, and to 4', 5', 6', and 7' for matrix 2. Similarly, in a known manner, each cell is capable of activation to write a sample of an analog signal and to read the sample by means of two control signals originating form a horizontal shift register 8, 8'and from a vertical register 9, 9'. The output circuit includes analog/digital converter 12, 12', for the conversion of the analog information read into a digital value, which appears at output terminal 14, 14'. The analog signal to be sampled and the same signal, except out of phase, are respectively applied to input terminals 15, 15'of input circuits 6, 6'of the two matrices 1 and 2. According to the invention, it is advantageous to provide in input circuit 6', for example, delay component 17 with a predetermined duration. The delay may be chosen to be one half-period of the sampling frequency of one of the input circuits or input channels 6, 6' in isolation.

Again, as shown in FIG. 1, each illustrated memory cell 3 of matrix 1 essentially comprises floating capacitor Cs for storing samples, the write circuit of which includes two switches S1 and S2 connected by an electrode, respectively, to write bus 5 and to a return bus that constitutes reference bus 20, capacitor Cs being connected between the two other electrodes of the switches.

The read circuit of capacitor Cs is also mounted between two read switches S3 and S4. One terminal of switch S3 is connected to an interconnection between storage capacitor Cs and switch S1, while the other electrode is connected to the output of reading amplifier 21, which is connected to a terminal of analog/digital converter 12. As far as switch S4 is concerned, one electrode is connected to the interconnection between capacitor Cs and switch S2. The other electrode is connected to an input of read amplifier 21, the other input of which is connected to reference potential 20. FIG. 1 further shows AND-gate 22, illustrated by way of example as the control for switch S1. The figure also schematically shows that one control signal from horizontal register 8 and one control signal produced by vertical register 9 are respectively applied to the two inputs of AND-gate 22.

In a manner similar to cell 3 of matrix 1, memory cell 3' of matrix 2 includes one storage capacitor Cs', the write circuit of which includes switches S1' and S2', while the read circuit includes switches S3' and S4'. The AND-gates and read amplifier of matrix 2 are designated by reference numbers 22' and 21'.

In FIG. 1, the acquisition system according to the invention, which, without delay component 17, presents a purely differential structure obtained by associating two distinct networks differentially connected, is represented in FIG. 2, as far as the structures of the memory cells are concerned, which are in the form of a differential cell. The structure, which makes it possible to access the elemental cells for both writing and reading, consists of a horizontal shift register comprised, for example, of 128 flip-flops used in writing and reading, and of a right vertical register with 20 flip-flops and a left register with another 20 flip-flops. The right register is used in the multiplexing reading process. The left and right registers may also be used in the process of sub-sampling by masking, in other words by masking the write pointer, which is necessary to reduce the writing frequency. The writing and reading operations are timed by a clock signal generated by a clock device which is not shown.

As far as the write logic is concerned, which is known in itself, suffice it to say that the write pointer passes through the matrix column by column, starting with the left column. When the first column is finished, the column pointer is shifted by means of a notch in the horizontal register so that it points to the second column, etc., until finishing the last column. At initialization, the first flip-flop in the register is therefore positioned at logic state 1 and all the others at 0.

In each column, the pointer is shifted vertically within a DLL type circuit. This circuit makes it possible to achieve delays that are submultiples of the time period of the system, here for example, 1/20. The duration of the vertical pointer traveling in the DLL must be calibrated to be less than the time period of the system. In order for a cell to be written, as indicated above, it must be at the intersection between one active row and one active column. If the vertical pointer has a period of 17 ns, then 17 cells are activated at a given instant, and at each ns the pointer moves one cell vertically, hence the writing frequency of one ns for a clock system at 50 MHz in this example.

As far as the reading frequency is concerned, this device makes use of a controller that sequences all operations, such as processing the pointer registers and controlling the various switches. This is a known technique and need not be described in further detail herein.

The differential memory cell with double floating capacitors comprises, in addition to what is shown in FIG. 1, two writing follower amplifiers 24, 24', which are connected upstream from switches S1 and S1'. In FIG. 2, the two elementary memory cells from FIG. 1 are now connected at the same reference number 20. A switch SO which makes it possible to optimize the passband of the cell as a function of the dimensions of switches S2, S2', and SO, advantageously formed by switching transistors, may be optionally connected, between the node connecting switches S2, S4, and capacitor Cs and the node connecting on switches S2' S4', and capacitor Cs'.

Illustrated in FIG. 2, within the dotted line rectangles, from left to right, are the one row writing device, the one row reading device, and the row multiplexing device.

In FIG. 2, reading amplifiers 21, 21' are inside the one row reading device and are connected to read switches S3, S4, and S3', S4' by means of respective switches S5, S6, S7 and S5', S6', and S7'. It is evident that the negative input of amplifier 21 is connected to switch S3 by means of switch S5, and to switch S4 by means of switch S6. The positive input is connected to switch S4 by means of switch S7. This description is similarly valid for amplifier 21'.

The multiplexing device comprises two output amplifiers 26, 26' and twenty multiplexing input switches connected in parallel, Sm0 to Sm19 and Sm0' to Sm19', which are capable of being selectively connected to the output of output amplifier 21, 21', corresponding to the one row reading device.

In regard to the operation of the cell in FIG. 2, switches having the same indices receive the same logic control signal. Thus, switches S1, S1', are simultaneously controlled. Switch SO receives the same control signal as switch S2 and S2'. As stated above, the input signal to be sampled is applied to input terminal 15, out of phase with respect to input terminal 15'. It is re-read at outputs 14 and 14'. Reference signal 20 may serve as the ground.

Below is a description of the operation of the sampling system according to the invention, which is confined to that half of the cell containing storage capacitor Cs, where the operation of the other half of the cell is identical since the structures of the two halves are identical.

The writing sequence by sampling of the signal applied to the input is carried out by switches S1 and S2. During the entire writing phase, switches S3 and S4 remain open and switches S5 and S7 closed. Switches S1 and S2 are simultaneously closed at the outset of sampling. They remain closed during the entire sampling phase. The end of sampling occurs when first switch S2 is opened, followed by opening of second switch S1 a few nanoseconds later. The one row reading system is returned to zero at each reading. The three switches S5, S6, S7 are used to return reading amplifier 21 to zero. Upon return to zero, switches S1, S2, S3, and S4 are open, and switches S5 and S7 are closed. Amplifier 21 is configured as a follower via switch S5. Switch S7 permits the residual charge stored in part of bus 29 to flow towards the reference. After returning to zero, the reading of each cell may take place. Switches S5 and S7 are open at the end of the return to zero phase and switch S6 is closed. Switches S3 and S4 are closed in order to connect capacitor Cs in counter-reaction to amplifier 21.

Reading is effected row by row in order to scan the entire matrix. The multiplexing switches are therefore closed one after the other in order to select each row in succession. Within each row, the various cells, namely the 128 cells in the example, are selected in succession by means of the above-mentioned switches and the return to zero sequence, and reading is repeated as many times as is necessary.

If there is a delay in channel 6' of the input signal out of phase with respect to the signal in channel 6, the process according to the invention requires a reading algorithm that is modified in relation to a purely differential structure without any delay. In effect, if the chosen delay is equal to one half-period of the sampling frequency, there are now two times as many samples to be digitized, and suppression of the common mode is no longer possible with a differential amplifier. It must be done by computation after digitization. The time shift caused by delay component 17 is equivalent to a system in which two sampling combs are interlaced by one half-period, since the sampling interval delay is divided by two. This results in the effective doubling of the sampling frequency of the system as configured.

Reconstitution of the sampled signal is done according to the expression:

$$ECH(2i-1)=ES(i)-ESI(i)+MS$$

$$ECH(2i)=ES(i+1)-ESI(i)+MS$$

where ECH (i) is the sample in row i, ES (i) is the sample in row i generated by the half-matrix that processes the non-inverted signal, ESI (i+1) is the sample in row i+1 generated by the half-matrix that processes the inverted signal, MS is the half-phase of the analog/digital converters, which is equal to $2^{11}$ for analog/digital converters with twelve binary digits.

Thanks to this reconstitution of the sampled signal, the invention makes it possible to efficiently eliminate the common mode. It is clear that the sum of the samples shifted by one index filters the reconstituted signal.

As far as the fabrication of the various switches is concerned, switches S1 and S1' are made using CMOS technology, while switches S2 to S7 and S2' to S7' are made using NMOS technology.

By proposing a structure of differential cells, the invention eliminates the defects of individual cells using a floating capacitor. The defects are caused by the high sensitivity of the system to noise in the substrate, particularly for capacitors made up of MOS transistors with metal tracks, by contamination of the recorded signal by the so-called "dropout" effect, and by a relatively low signal-to-noise ratio. As far as contamination is concerned, the charge stored on the memory capacitors slowly escapes via leaks in the switches, hence the error rate increases with retention time. This error rate is not the same for the first cells read as for the last ones. Therefore, it is difficult to compensate for this defect by computation. The signal-to-noise ratio is limited by the noise generated by parasitic capacitive coupling with the digital signals. The low memory capacitor level dictated by the desired passband leads to a significant sensitivity to coupled noise.

These defects all share a common element: they are expressed at the output independently of the input signal. To eliminate these defects, the invention provides for the entire matrix to be duplicated in order to create a differential system to process two signals out of phase. In this way, distortions will be read as the common mode and eliminated by common mode rejection of the reading device. In addition, the maximum amplitude of the available signal is doubled, due to the differential mode, in relation to a single solution. Thus, even without any rejection of the common mode, the signal-to-noise ratio is already improved by 6 dB. Rejection of the common mode is even more effective vis-a-vis parasitic signals because the two structures are symmetrical. In this connection, the fact that the matrix is composed of differential elementary memory cells is particularly advantageous.

Concerning the delay system, it provides the advantages of doubling the sampling frequency and doubling memory capacity without any noticeable degradation in the signal-to-noise ratio.

What is claimed is:

1. An acquisition process for sampling analog signals, comprising sampling an analog signal at a first speed, storing samples of the analog signal in a matrix of memory cells, and re-reading the samples stored from the memory cells at a second speed, lower than the first speed, wherein identical first and second memory devices are included in each memory cell, a first sample of the analog signal being stored in the first memory device, and a second sample of that analog signal, taken out of phase with the first sample, being stored in the second memory device.

2. The process according to claim 1, wherein the analog signal is delayed for a one half-period of a sampling signal before being sampled and supplied to the second memory device.

3. An acquisition system for analog signal sampling, comprising:
   a matrix of analog memory cells arranged in a plurality of rows and columns, each cell being connected to a write bus and a read bus, and having two inputs for activation control signals, derived from a clock signal;
   a horizontal shift register and a vertical register, for applying activation control signals to the cells for the write and read functions of the cells,
   each of the write bus and the read bus having two channels, a first of the two write bus channels receiving the analog signal to be sampled, out of phase in relation to a second of the write bus channels,
   each memory cell comprising two memory devices, each memory device being connected to a corresponding one of the two write bus channels and the two read bus channels.

4. The system according to claim 3, comprising two inputs receiving, respectively, the analog signal to be sampled and the analog signal to be sampled out of phase.

5. The system according to claim 4, wherein an input circuit of one of the two write bus channels has a delay component having a duration corresponding to one half-period of a sampling frequency.

6. The system according to claim 3, wherein each of the two memory devices of one memory cell includes a respective storage capacitor connected to float in a writing circuit between the write bus and a reference potential, and connected to float in a reading circuit between the read bus and the reference potential, the writing and reading circuits having selectively controlled switches.

7. The system according to claim 6, wherein the storage capacitors are connected in the writing circuit between two of the switches.

8. The system according to claim 6, wherein the storage capacitor capacitors are connected in the reading circuit between two of the switches.

9. The system according to claim 8, including a reference switch, wherein the two storage capacitors are connected by the reference switch, enlarging cell passband.

10. The system according to claim 6, wherein one of the memory cells is a differential cell, in which the reference potential is common to the two memory devices of the one memory cell.

11. The system according to claim 4, including a device for reconstituting the sampled signal by computation, after digitization.

* * * * *